(12) United States Patent
Yudanov

(10) Patent No.: US 12,229,060 B2
(45) Date of Patent: *Feb. 18, 2025

(54) MEMORY MODULE WITH COMPUTATION CAPABILITY

(71) Applicant: Micron Technology, Inc., Boise, ID (US)

(72) Inventor: Dmitri Yudanov, Rancho Cordova, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/554,400

(22) Filed: Dec. 17, 2021

(65) Prior Publication Data

US 2022/0107907 A1 Apr. 7, 2022

Related U.S. Application Data

(63) Continuation of application No. 16/713,989, filed on Dec. 13, 2019, now Pat. No. 11,232,049.

(51) Int. Cl.
*G06F 13/16* (2006.01)
*G06F 13/40* (2006.01)

(52) U.S. Cl.
CPC ...... *G06F 13/1668* (2013.01); *G06F 13/4027* (2013.01)

(58) Field of Classification Search
CPC .......................... G06F 13/1668; G06F 13/4027
See application file for complete search history.

(56) References Cited

U.S. PATENT DOCUMENTS

| 5,539,913 A | 7/1996 | Furuta et al. |
| 5,832,397 A * | 11/1998 | Yoshida .............. B60R 16/0315 701/32.7 |
| 7,669,036 B2 | 2/2010 | Brown et al. |
| 10,002,043 B2 | 6/2018 | Hu et al. |

(Continued)

FOREIGN PATENT DOCUMENTS

| CN | 102024999 | 4/2011 |
| CN | 104777762 | 7/2015 |

(Continued)

OTHER PUBLICATIONS

International Search Report and Written Opinion, PCT/US2020/062980, mailed on Apr. 1, 2021.

(Continued)

*Primary Examiner* — Nimesh G Patel
(74) *Attorney, Agent, or Firm* — Greenberg Traurig

(57) ABSTRACT

A memory module having a plurality of memory chips, at least one controller (e.g., a central processing unit or special-purpose controller), and at least one interface device configured to communicate input and output data for the memory module. The input and output data bypasses at least one processor (e.g., a central processing unit) of a computing device in which the memory module is installed. And, the at least one interface device can be configured to communicate the input and output data to at least one other memory module in the computing device. Also, the memory module can be one module in a plurality of memory modules of a memory module system.

16 Claims, 5 Drawing Sheets

(56) References Cited

U.S. PATENT DOCUMENTS

| | | | |
|---|---|---|---|
| 10,002,044 B2 | 6/2018 | Hu et al. | |
| 10,824,499 B2 | 11/2020 | Hu et al. | |
| 11,232,049 B2 | 1/2022 | Yudanov | |
| 2002/0085497 A1 | 7/2002 | Phillips et al. | |
| 2002/0194442 A1 | 12/2002 | Yanai et al. | |
| 2003/0046486 A1* | 3/2003 | Zitlaw | G11C 11/4072 711/105 |
| 2008/0040530 A1 | 2/2008 | Takeda | |
| 2008/0077761 A1 | 3/2008 | Subashchandrabose et al. | |
| 2008/0301329 A1* | 12/2008 | Arima | G06F 13/28 710/27 |
| 2012/0131278 A1 | 5/2012 | Chang et al. | |
| 2014/0047060 A1* | 2/2014 | Chen | H04L 67/40 709/213 |
| 2014/0101279 A1 | 4/2014 | Nagami et al. | |
| 2014/0149969 A1* | 5/2014 | Brower | G06F 8/73 717/140 |
| 2014/0201761 A1 | 7/2014 | Dalal et al. | |
| 2014/0258620 A1 | 9/2014 | Nagarajan et al. | |
| 2015/0255130 A1 | 9/2015 | Lee et al. | |
| 2016/0055052 A1 | 2/2016 | Hu et al. | |
| 2016/0055058 A1 | 2/2016 | Zheng et al. | |
| 2016/0183191 A1* | 6/2016 | Badam | H04W 8/183 370/311 |
| 2016/0299856 A1 | 10/2016 | Fruchter et al. | |
| 2016/0321777 A1* | 11/2016 | Jin | G06N 3/0454 |
| 2017/0228335 A1 | 8/2017 | Anubolu et al. | |
| 2018/0107406 A1* | 4/2018 | O | G11C 5/04 |
| 2018/0113628 A1 | 4/2018 | Roberts | |
| 2018/0129553 A1 | 5/2018 | Hu et al. | |
| 2018/0285288 A1 | 10/2018 | Bernat et al. | |
| 2019/0108145 A1* | 4/2019 | Raghava | G06F 13/124 |
| 2019/0182956 A1 | 6/2019 | Kim et al. | |
| 2019/0213029 A1* | 7/2019 | Liu | G06F 15/7867 |
| 2019/0297015 A1 | 9/2019 | Marolia et al. | |
| 2019/0317917 A1 | 10/2019 | Nishizono et al. | |
| 2019/0332438 A1* | 10/2019 | Li | G06F 1/3296 |
| 2020/0401352 A1* | 12/2020 | Smolka | G06F 3/0679 |
| 2021/0011755 A1 | 1/2021 | Shah | |
| 2021/0182220 A1 | 6/2021 | Yudanov | |

FOREIGN PATENT DOCUMENTS

| | | |
|---|---|---|
| CN | 105373345 | 3/2016 |
| CN | 106203642 | 12/2016 |
| CN | 109061224 | 12/2018 |
| CN | 109443766 | 3/2019 |
| JP | 2003256273 | 9/2003 |
| JP | 2015201233 | 11/2015 |

OTHER PUBLICATIONS

TensorDIMM: A Practical Near-Memory Processing Architecture for Embeddings and Tensor Operations in Deep Learning. Arxiv.org, Cornell University Library, Aug. 8, 2019.

Extended European Search Report, EP20897793.4, mailed on Nov. 23, 2023.

\* cited by examiner

MEMORY MODULE WITH COMPUTATION CAPABILITY

RELATED APPLICATION

The present application claims priority to U.S. patent application Ser. No. 16/713,989, filed Dec. 13, 2019 and entitled "MEMORY MODULE WITH COMPUTATION CAPABILITY," the entire disclosure of which is hereby incorporated herein by reference.

FIELD OF THE TECHNOLOGY

At least some embodiments disclosed herein relate to a memory module with computation capability. And, at least some embodiments disclosed herein relate to a system having a plurality of such memory modules.

BACKGROUND

In general, computer hardware components can be mounted onto a printed circuit board (PCB). Also, computer hardware components can be integrated into integrated circuits. And, such integrated circuits can be mounted onto a PCB. PCB can mechanically support and electrically connect electronic components using conductive tracks, pads and other features.

Memory modules can include a PCB, in which multiple memory components are mounted onto a PCB. Examples of such memory modules include single in-line memory modules (SIMMs) and dual in-line memory modules (DIMMS). A single in-line memory module (SIMM) is a type of memory module containing random-access memory. A SIMM differs from a dual in-line memory module (DIMM) in that the contacts on a SIMM are redundant on both sides of the module. This is not the case with a DIMM. DIMMs have separate electrical contacts on each side of the module. Another difference is that SIMMs usually have a 32-bit data path, while DIMMs usually have a 64-bit data path. DIMMs are commonly used in current computers large enough to include one or more DIMMs, and a DIMM can include multiple dynamic random-access memory (DRAM) integrated circuits. For a smaller computer, such as laptop computers, often a small outline dual in-line memory module (SO-DIMM) is used.

Also, memory components can be integrated onto a system on a chip (SoC). A SoC is an integrated circuit (IC) that integrates computer components in a single chip. Computer components common in a SoC include a central processing unit (CPU), memory, input/output ports and secondary storage. A SoC can have all its components on a single substrate or microchip, and some chips can be smaller than a quarter. A SoC can include various signal processing functions and can include specialty processors or co-processors such as graphics processing unit (GPU). By being tightly integrated, a SoC can consume much less power than conventional multichip systems of equivalent functionality. This makes a SoC beneficial for integration of mobile computing devices (such as in smartphones and tablets). Also, a SoC can be useful for embedded systems and the Internet of Things (especially when the smart device is small).

BRIEF DESCRIPTION OF THE DRAWINGS

The present disclosure will be understood more fully from the detailed description given below and from the accompanying drawings of various embodiments of the disclosure.

DETAILED DESCRIPTION

At least some embodiments disclosed herein include a memory module with computation capability. And, at least some embodiments disclosed herein include a system having a plurality of such memory modules. More specifically, at least some embodiments disclosed herein include a memory module having a plurality of memory chips, at least one controller (e.g., a central processing unit or special-purpose controller), and at least one interface device configured to communicate input and output data for the memory module. The input and output data bypasses at least one processor (e.g., a central processing unit) of a computing device in which the memory module is installed. And, the at least one interface device can be configured to communicate the input and output data to at least one other memory module in the computing device. Also, the memory module can be one module in a plurality of memory modules of a memory module system.

In some embodiments, the memory module can be or include a DIMM, a SO-DIMM, a registered DIMM (RDIMM), a mini-RDIMM, a socketed memory stack, or a socketed system on package or another type of package on package (PoP) for memory. And, in some embodiments, the memory module can be configured to include a special purpose chip, such as a GPU, an artificial intelligence (AI) accelerator, and/or a processing-in-memory (PIM) unit. Also, in some embodiments, the memory module is capable of outputting results to a peripheral device (e.g., a display or another type of user interface) through a wired connection, a wireless connection, or a combination thereof without going through a memory bus between a processor and the memory module. For example, in some embodiments, the memory module is capable of outputting results to a peripheral device through a wired connection or wireless connection without going through a memory bus between the memory module and the main processor of a computing device hosting the memory module. Such a memory module and other memory modules disclosed herein can accelerate processing of a graphics pipeline (e.g., data processing for geometry, projection, lighting, clipping, rasterization, shading, screen streaming, etc.). Also, a system having a plurality of such memory modules communicating with each other can further accelerate processing of a graphics pipeline.

Figure 1:
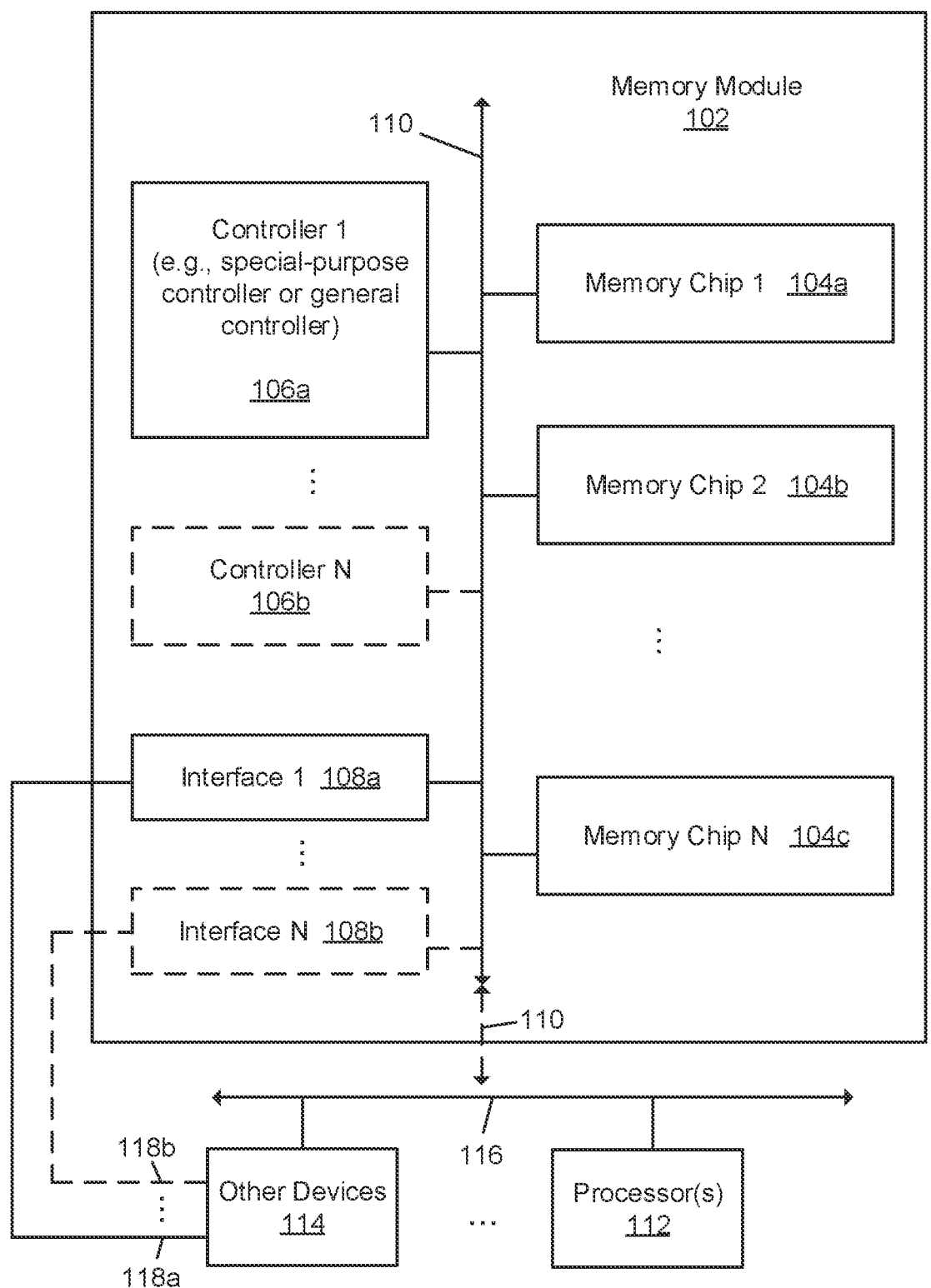
FIGS. 1 and 2 illustrate example memory modules, in accordance with some embodiments of the present disclosure.
Figure 2:
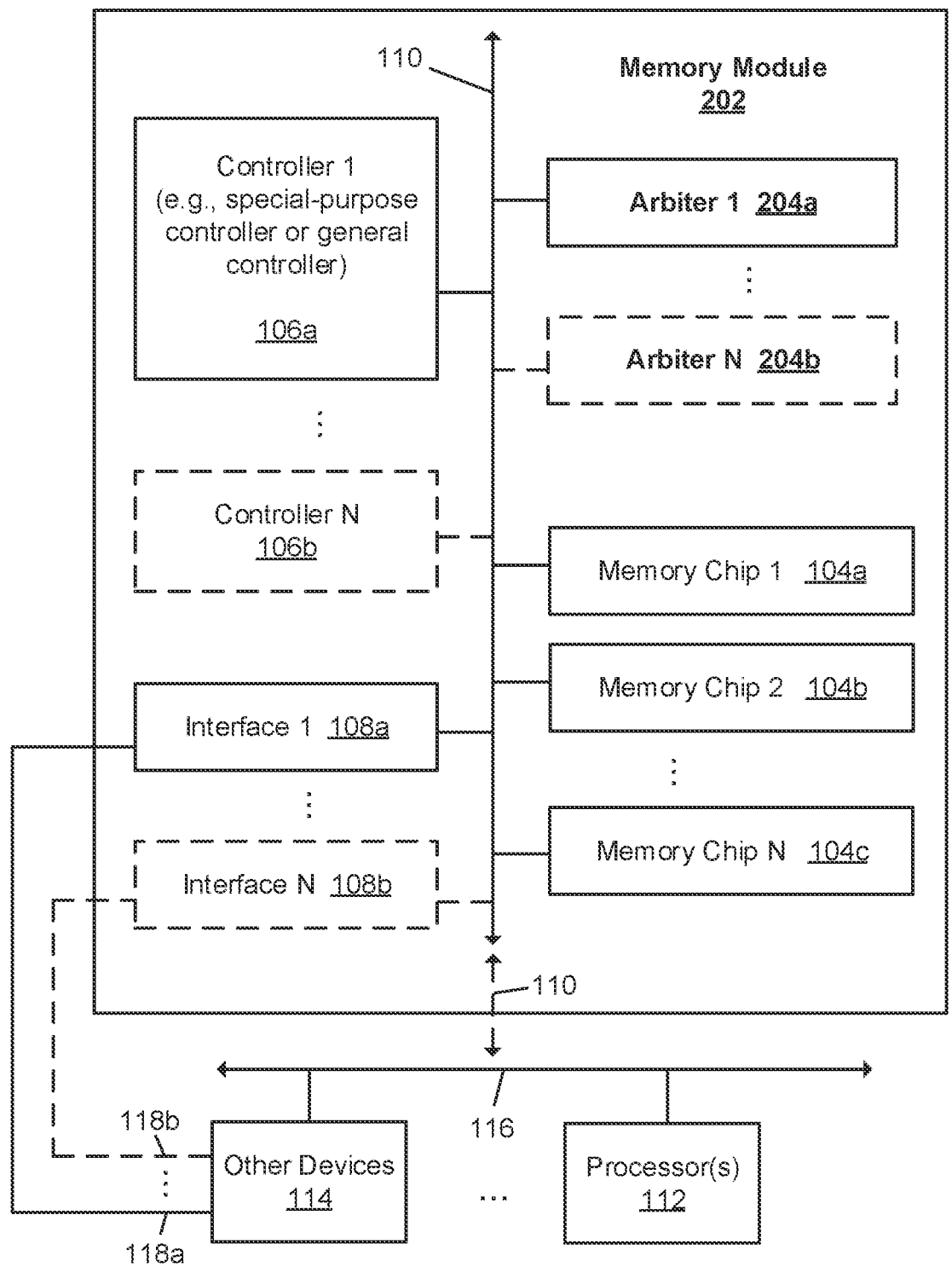

FIGS. 1 and 2 illustrate example memory modules 102 and 202 respectively, in accordance with some embodiments of the present disclosure. Either of the memory modules 102 or 202 can be, include, or be a part of an apparatus and/or a system.

FIG. 1 shows the memory module 102 having a plurality of memory chips (e.g., see memory chips 104a, 104b, and 104c). The memory module 102 also has at least one controller (e.g., see controllers 106a and 106b). As shown, different embodiments of the memory module 102 can have one controller (e.g., controller 106a), two controllers (e.g., controllers 106a and 106b), or more than two controllers. It is to be understood that the dashed-lined boxes represent optional components. Also, it is to be understood that an embodiment of the memory module 102 can have two memory chips or more than two memory chips.

Memory described herein, such as memory of the memory modules, can include various types of memory. For example, such memory can include flash memory having flash memory cells. Also, for example, such memory can include dynamic random-access memory (DRAM) including DRAM cells. Also, for example, such memory can also include non-volatile random-access memory (NVRAM) including NVRAM cells. The NVRAM cells can include 3D XPoint memory cells.

The memory module 102 is also shown having at least one interface device (e.g., see interface devices 108a and 108b). As shown, different embodiments of the memory module 102 can have one interface device (e.g., interface device 108a), two interface devices (e.g., interface devices 108a and 108b), or more than two interface devices. And, as mentioned, it is to be understood that the dashed-lined boxes represent optional components. The at least one interface device (e.g., see interface devices 108a and 108b) can be configured to communicate input and output data for the memory module 102. The input and output data can bypass a processor (e.g., the main processor) of a system in which the memory module 102 is installed (e.g., see interfaces 108a and 108b being connected to other devices 114 of a system in which the memory module 102 is installed and bypassing one or more processors 112 of the system in which the memory module is installed, via connections 118a and 118b). In some embodiments, as shown in FIG. 1, the input and output data bypasses a data bus (such as the main data bus) of the system in which the memory module 102 is installed (e.g., see interfaces 108a and 108b being connected to other devices 114 of the system in which the memory module is installed and bypassing one or more busses 116 of the system in which the memory module is installed, via connections 118a and 118b). It is to be understood that the dashed-lined connections represent optional connections.

The memory module 102 is also shown having a bus 110 (which can include multiple busses) that connects the plurality of memory chips (e.g., see memory chips 104a, 104b, and 104c), the controller(s) (e.g., see controllers 106a and 106b), and the interface device(s) (e.g., see interface devices 108a and 108b). The bus 110 can be a part of a bus of the system in which the memory module is installed (e.g., see one or more busses 116), which connects the memory module 102 to the rest of the system in which it is installed. As shown by the dashed-lined portion of the bus 110 that connects the memory module to the one or more busses 116 and the rest of the system, bus 110 may be separate from bus 116 in some embodiments and in other embodiments it may be connected to the one or more busses 116. It is to be understood that the dashed-lined connections represent optional connections. One or more of the controllers of the memory module 102 (e.g., see controllers 106a and 106b) can arbitrate data communicated over bus 110 and connections that bypass the one or more busses 116 (e.g., see connections 118a and 118b).

The interface devices and other interface devices mentioned herein can include one or more network interface devices, one or more links, one or more buses, one or more ports, one or more peer-to-peer links, or any combination thereof.

In some embodiments, the memory module 102 can implement a global shared context. In general, a global shared context includes a plurality of instances of the memory module 102 or 202 communicating with each other via their interface devices. The global shared context can be beneficial for graphics processing and graphics applications since large amounts of memory is useful and data processing proximate to memory can improve graphics processing. In such embodiments and others, the interface device(s) (e.g., see interface devices 108a and 108b) can be configured to communicate the input and output data to at least one other instance of the memory module installed in the system in which the communicating memory module is installed.

In some embodiments, the memory module 102 or another memory module described herein, the controller 106a or another controller described herein, the interface device 108a or another interface device described herein, the memory chips 104a, 104b, and 104c or other memory chips described herein, or any combination thereof can be a part of a system on chip (SoC), system on package (SoP) such as an interposed chiplet system, or a heterogeneous die stack or alike. All of these embodiments represent tightly integrated IP blocks and chips not necessarily including a PCB for coupling with each other and the rest of the system. Embodiments including or being a part of an SoC or other embodiments can include one or more GPUs or one or more other types of specialty processors and/or one or more PIM units. Embodiments including or being a part of an SoC or other embodiments can include processors that can include or are connected to a memory controller, a display sink (e.g. HDMI or DisplayPort), a radio for a wireless interface or network, an AI engine or accelerator, neuromorphic processor, scalar-type processors, vector-type processors, CPU cores, and the like.

Not shown in FIG. 1, the memory module 102 can also include a plurality of electrical contacts. The memory module 102 can also include a PCB configured for insertion into at least one memory slot of a motherboard. In such embodiments, the plurality of memory chips (e.g., see memory chips 104a, 104b, and 104c) can be coupled to the PCB, and the plurality of electrical contacts can be on each side of the PCB. Also, the controller(s) (e.g., see controllers 106a and 106b) can be coupled to the PCB, and the interface device(s) (e.g., see interface devices 108a and 108b) can be coupled to the PCB.

In some embodiments, the controller(s) (e.g., see controllers 106a and 106b) can be, include, or be a part of at least one special-purpose controller. The special-purpose controller(s) can be, include, or be a part of a GPU, an AI accelerator, a neural processing unit (NPU), another type of special-purpose controller, a PIM unit, or any combination thereof.

In some embodiments, the interface device(s) (e.g., see interface devices 108a and 108b) can include at least one wireless interface device that communicates at least in part wirelessly or can include intra-chip optical interconnect that provides optical communication between chips. Another part of the interface device(s) can communicate via a wire. An interface device can also be a hybrid interface device with multiple capabilities and/or channels and channel types. The interface device(s) can be, include, or be a part of a network interface device (such as a wireless network interface device). The interface device(s) can include at least one wireless interface device and/or wired links can be configured to communicate over one or more wired and/or wireless networks, peer-to-peer links, ports, buses, etc.

In some embodiments, the memory module 102 can include first connections configured to connect the plurality of memory chips (e.g., memory chips 104a, 104b, and 104c) to at least some of the plurality of electrical contacts to communicate input and output data of the plurality of memory chips to a processor of a computing device in which the memory module 102 is installed (such as the main processor of the computing device). The memory module 102 can also include second connections configured to connect the plurality of memory chips to the controller(s) (e.g., see controllers 106a and 106b). The memory module 102 can also include one or more third connections configured to connect the controller(s) to the interface device(s) (e.g., see interface devices 108a and 108b) so that the interface device(s) receive input data for the controller(s) from other devices and communicates output data of the controller(s) to other devices via a communications path that bypasses a processor of the computing device in which the memory module 102 is installed.

FIG. 2 shows a memory module 202 that is somewhat similar to memory module 102. However, memory module 202 is shown having at least one arbiter (e.g., see arbiters 204a and 204b). FIG. 2 shows the memory module 202 having a similar plurality of memory chips as the chips shown in FIG. 1 (e.g., see memory chips 104a, 104b, and 104c). The memory module 202 also has at least one controller similar to the at least one controller shown in FIG. 1 (e.g., see controllers 106a and 106b). As shown in FIG. 2 as well, different embodiments of the memory module 102 can have one controller (e.g., controller 106a), two controllers (e.g., controllers 106a and 106b), or more than two controllers. It is to be understood that the dashed-lined boxes represent optional components. Also, it is to be understood that an embodiment of the memory module 202 can have two memory chips or more than two memory chips.

Also, as show in FIG. 2, the memory module 202 is depicted having at least one interface device similar to the at least one interface device shown in FIG. 1 (e.g., see interface devices 108a and 108b). As shown, different embodiments of the memory module 202 can have one interface device (e.g., interface device 108a), two interface devices (e.g., interface devices 108a and 108b), or more than two interface devices. And, as mentioned, it is to be understood that the dashed-lined boxes represent optional components. The at least one interface device (e.g., see interface devices 108a and 108b) can be configured to communicate input and output data for the memory module 202. The input and output data can bypass a processor (e.g., the main processor) of a system in which the memory module 202 is installed. In some embodiments, the input and output data bypasses a data bus (such as the main data bus) of the system in which the memory module 202 is installed.

Additionally, as mentioned and as shown in FIG. 2, the memory module 202 includes at least one arbiter (e.g., arbiters 204a and 204b). The arbiter(s) can be configured to resolve conflicts when the processor of the hosting computing device attempts to access data in the plurality of memory chips (e.g., see memory chips 104a and 104b) while the controller(s) (e.g., see controllers 106a and 106b) is accessing the plurality of memory chips. As shown, different embodiments of the memory module 202 can have one arbiter (e.g., arbiter 204a), two arbiters (e.g., arbiters 204a and 204b), or more than two arbiters. And, as mentioned, it is to be understood that the dashed-lined boxes and connections represent optional components.

In some embodiments, the arbiters can be part of the controllers such that each controller has one arbiter to arbitrate access to memory chips among all devices that access these chips and external devices (main processor and system). In other embodiments the arbiters can be part of memory chips such that each arbiter would queue the memory requests to respective chip in order of processing and can resolve conflicts associated with requests to the same address within a memory chip. Also, in some embodiments, one or more of the arbiters of the memory module 202 (e.g., see arbiters 204a and 204b) can arbitrate data communicated over bus 110 and connections that bypass the one or more busses 116 of the system in which the memory module 202 is installed (e.g., see connections 118a and 118b).

As mentioned and shown in FIGS. 1 and 2, the memory module 102 and the memory module 202 include a plurality of memory chips, at least one controller (e.g., a special-purpose controller), and at least one interface device configured to communicate input and output data for the memory module. The input and output to the module data bypasses a processor of a computing device in which the memory module 102 or 202 is installed. And, the interface device(s) can be configured to communicate the input and output data to at least one other memory module in the computing device (not depicted in FIGS. 1 and 2). In some embodiments, input and output data or a part of it is communicated via and processed by the main processor (such as to register a memory module's state).

The interface devices of the memory modules 102 and 202 each can include at least one network interface device that can be configured to communicate input and output data of the controller(s) over one or more communication networks. The controller(s) can include at least GPU, an AI accelerator, an NPU, another type of special-purpose controller, a PIM unit, or any combination thereof. The interface devices of the memory modules 102 and 202 each can include at least one wireless interface device configured to communicate at least in part wirelessly over one or more wireless communication networks, and the one or more wireless communication networks can bypass a data bus (such as a main data bus) of the computing device in which the memory module 102 or 202 is installed. In some embodiments, a wireless communication can occur among multiple memory modules installed in the system. For example, a wireless receiver can allow for data communications between aligned-in-space modules in close proximity (like DIMMs installed in a PC board). This can increase speeds of such communications. Specifically, in some embodiments, Terahertz Wireless Communication (THz) can enable speeds of $100s$ Gb/sec. Thus, in such examples, intra-chip or intra-module THz radiation can support large volume of data exchange amongst memory modules disclosed herein.

And, as shown specifically in FIG. 2, the memory module 202 includes at least one arbiter configured to resolve conflicts when the processor of the computing device having the memory module attempts to access data in the plurality of memory chips while a controller of the memory module is accessing the plurality of memory chips of the memory module.

Figure 3:
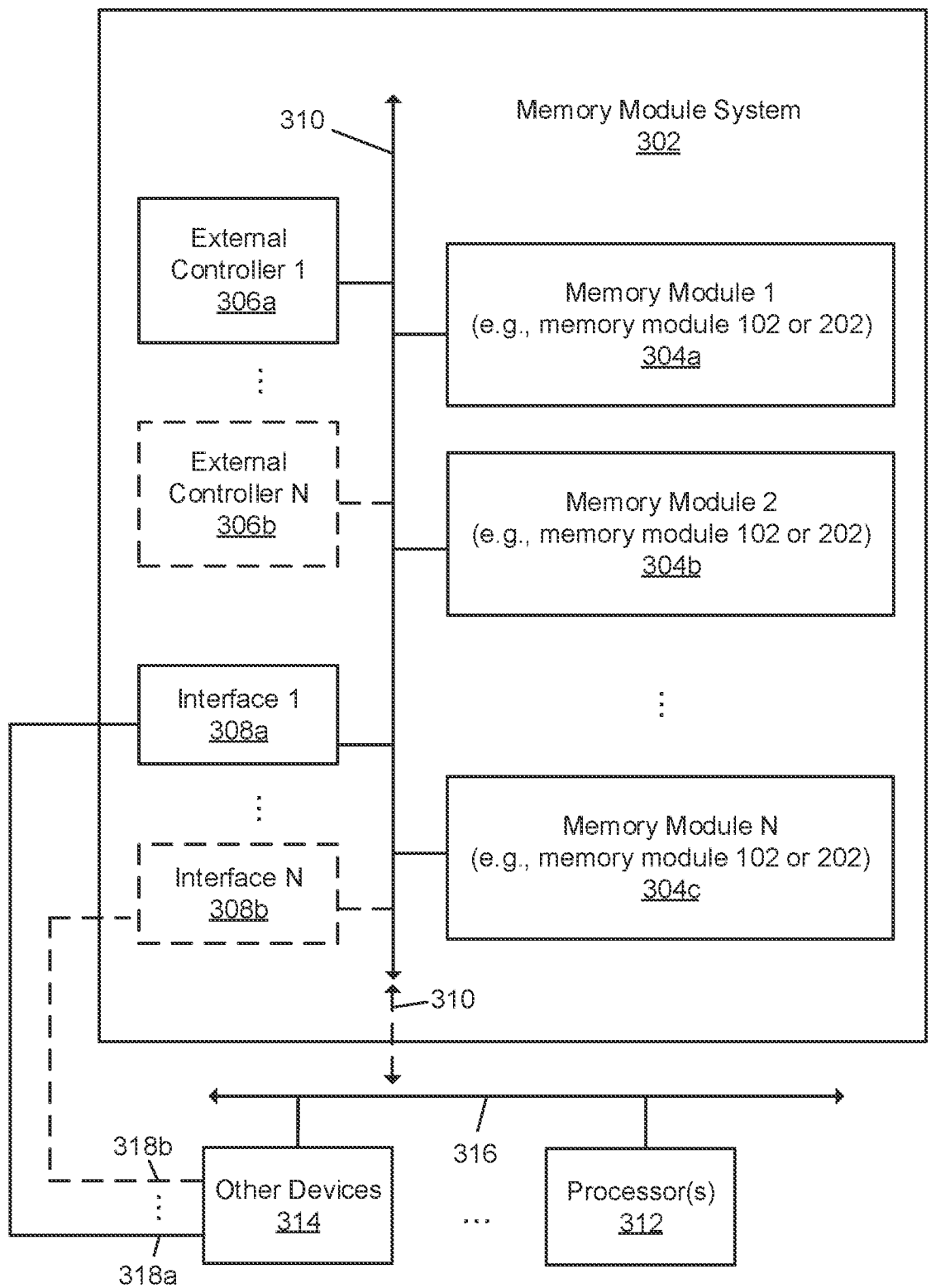
FIGS. 3 and 4 illustrate example memory module systems, in accordance with some embodiments of the present disclosure.
Figure 4:
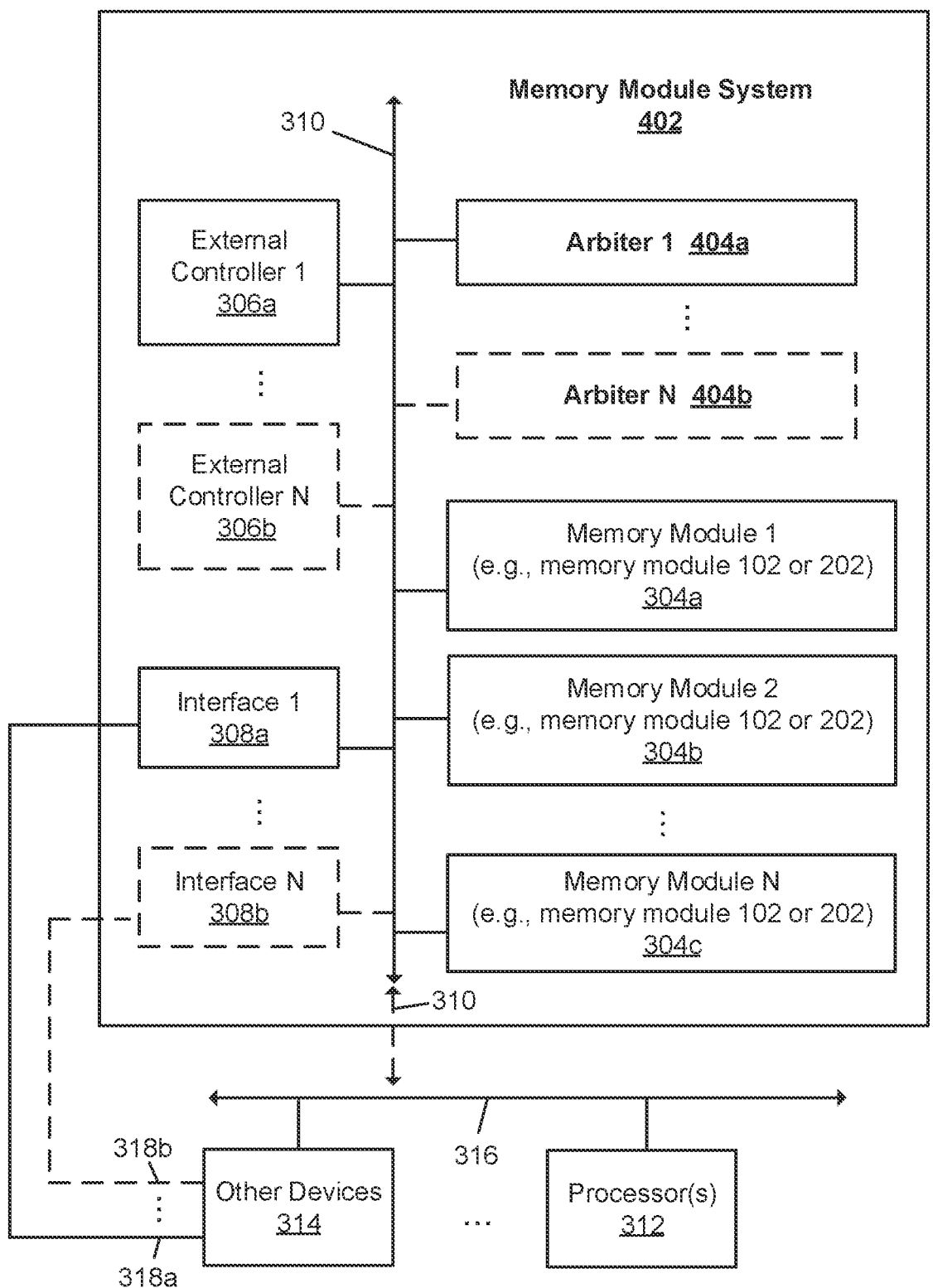

FIGS. 3 and 4 illustrate example memory module systems 302 and 402 respectively, in accordance with some embodiments of the present disclosure. FIG. 4 shows the memory module system 402 which is somewhat similar to memory module system 302 depicted in FIG. 3. However, memory module system 402 is shown having at least one arbiter (e.g., see arbiters 404a and 404b). An arbiter shown as included in the memory module system 402 can be configured to resolve conflicts when a processor of the computing device having or hosting the memory module system 402 attempts to access data in one or more memory chips of the memory module system while a controller within the memory module system is accessing the memory chips.

Both of the depicted memory module systems 302 and 402 include a plurality of memory modules (e.g. see memory modules 304a, 304b, and 304c). And, each of the memory modules includes a plurality of memory chips. Each memory module of the plurality of memory modules (e.g. see memory modules 304a, 304b, and 304c) can be the memory module 102 or the memory module 202. The memory module systems 302 and 402 each also include at least one external controller (e.g., see external controllers 306a and 306b) and at least one interface device (e.g., see interface devices 308a and 308b).

The memory module systems 302 and 402 are each shown having a bus 310 (which can include multiple busses) that connects the plurality of memory modules (e.g., see memory modules 304a, 304b, and 304c), the external controller(s) (e.g., see external controllers 306a and 306b), and the interface device(s) (e.g., see interface devices 308a and 308b).

The memory module systems 302 and 402 are each also shown having interface devices (e.g., see interface devices 308a and 308b). As shown, different embodiments of the memory modules 302 and 402 can have one interface device (e.g., interface device 308a), two interface devices (e.g., interface devices 308a and 308b), or more than two interface devices. And, as mentioned, it is to be understood that the dashed-lined boxes represent optional components. Interface device (e.g., see interface devices 308a and 308b) can be configured to communicate input and output data for each of the memory module systems 302 and 402. The input and output data can bypass a processor (e.g., the main processor) of a respective system in which one of the memory module systems 302 and 402 is installed (e.g., see interfaces 308a and 308b being connected to other devices 314 of a system in which one of the memory module systems 302 and 402 is installed and bypassing a processor 312 of the system, via connections 318a and 318b). In some embodiments, as shown in FIG. 3, the input and output data bypasses a data bus (such as the main data bus) of the system in which one of the memory module systems 302 and 402 is installed (e.g., see interfaces 308a and 308b being connected to other devices 314 of the system and bypassing a bus 316 of the system (which can have multiple buses), via connections 318a and 318b). It is to be understood that the dashed-lined connections represent optional connections.

Also, the bus 310 can be a part of a bus of the system in which one of the memory module systems 302 and 402 is installed (e.g., see bus 316), which connects one of the memory module systems 302 and 402 to the rest of the system in which it is installed. As shown by the dashed-lined portion of the bus 310 that connects the memory module system to the bus 316 and the rest of the system, the bus 310 may be separate from bus 316 in some embodiments and in other embodiments it may be connected to the bus 316. It is to be understood that the dashed-lined connections represent optional connections. One or more of the controllers of each of the memory module systems 302 and 402 (e.g., see controllers 306a and 306b) can arbitrate data communicated over bus 310 and connections that bypass the bus 316 (e.g., see connections 318a and 318b).

As shown, the external controller(s) (e.g., see external controllers 306a and 306b) is separate from the plurality of memory modules (e.g. see memory modules 304a, 304b, and 304c) in each of the memory module systems 302 and 402. In some embodiments of the memory module systems 302 and 402, the at least one external controller can be configured to coordinate computations by the controllers of the plurality of memory modules (e.g., see the controllers 106a and 106b and the memory modules 102, 202, and 304a to 304c). Also, the external controller(s) can be configured to coordinate communications by the interface devices of the plurality of memory modules (e.g., see interface devices 108a and 108b and the memory modules 102, 202, and 304a to 304c).

Also, as shown, an interface device (e.g., see interface devices 308a and 308b) can be separate from the plurality of memory modules (e.g. see memory modules 304a, 304b, and 304c) in each of the memory module systems 302 and 402. The interface devices of the memory module systems 302 and 402 (e.g., see interface devices 308a and 308b) each can include a wireless interface device that communicates at least in part wirelessly or can include intra-chip optical interconnect that provides optical communication between chips. Another part of the interface devices of the memory module systems 302 and 402 can communicate via wires. The interface devices of the memory module systems 302 and 402 each can also be a hybrid interface device with multiple capabilities and/or channels and channel types. The interface devices of the memory module systems 302 and 402 can each be, include, or be a part of a network interface device (such as a wireless network interface device). The interface devices of the memory module systems 302 and 402 can each include a wireless interface device and/or wired links can be configured to communicate over one or more wired and/or wireless networks, peer-to-peer links, ports, buses, etc.

Also, the plurality of memory modules (e.g. see memory modules 304a, 304b, and 304c) can be a plurality of different types of memory structures. For example, the plurality of memory modules can be, be a part of, or include one or more DIMMs, one or more SO-DIMMs, one or more RDIMMs, one or more mini-RDIMMs, one or more socketed memory stacks, one or more socketed systems on package or another type of PoP for memory, one or more of a different type of memory structure or module, or any combination thereof.

Also, each memory module described herein can be a different type of memory structure. For example, a memory module described herein can be, be a part of, or include a DIMM, a SO-DIMM, a RDIMM, a mini-RDIMM, a socketed memory stack, or a socketed system on package or another type of PoP for memory.

For example, in some embodiments of the memory module system 302 or 402, the system can include a plurality of DIMMs. And, each DIMM of the plurality of DIMMs can include a PCB configured for insertion into a memory slot of an additional PCB that is separate from the plurality of DIMMs. Also, each DIMM of the plurality of DIMMs can include a plurality of memory chips coupled to the PCB, a plurality of electrical contacts on each side of the PCB, at least one controller (such as at least one special-purpose controller) coupled to the PCB, and at least one interface device configured to communicate input and output data for the DIMM. The input and output data bypasses a processor of a computing device in which the DIMM and the system is installed. And, in such embodiments of systems 302 and 402 having DIMMS, the at least one interface device can be configured to communicate the input and output data to at least one other DIMM of the plurality of DIMMs.

Also, in such embodiments of systems 302 and 402 having DIMMs, the at least one external controller is separate from the plurality of DIMMs and can be configured to coordinate computations by the special-purpose controllers of the plurality of DIMMs. The at least one external controller can also be configured to coordinate communications by the interface devices of the plurality of DIMMs. And, in such embodiments, the additional PCB is separate from the plurality of DIMMs and can include a plurality of memory slots configured to receive the plurality of DIMMs. Also, the external controller(s) can be coupled to the additional PCB, and the additional PCB can be a motherboard and the external controller(s) can include a central processing unit (CPU) or another type of processor such as a special-purpose controller.

In some embodiments, the at least one controller of each DIMM of the plurality of DIMMs can be a special-purpose controller. For example, a controller can be, be a part of, or include a GPU, an AI accelerator, an NPU, another type of special-purpose controller, a PIM unit, or any combination thereof.

In some embodiments, the one interface device(s) of a DIMM of the plurality of DIMMs can include a wireless interface device configured to communicate at least in part wirelessly or can include intra-chip optical interconnect that provides optical communication between chips. And, in such examples, for each DIMM of the plurality of DIMMs, the wireless interface device of the DIMM can be configured to receive input data for a controller and communicate output data of the controller to one or more user interfaces via one or more wireless communication links that bypass the processor of the computing device hosting the system 302 or 402 in which the system is installed. The one or more user interfaces can include one or more of any type of user interface (UI), including tactile UI (touch), visual UI (sight), e.g., GUI (via graphics display or monitor), auditory UI (sound), olfactory UI (smell), equilibria UI (balance), gustatory UI (taste), or any combination thereof.

In some embodiments, the DIMMs can communicate with each other via one or more high-speed wireless interfaces. Since DIMMs can be installed, aligned, and close to each other high-speed wireless interfaces with proximate transmitters can be used to transmit data among DIMMs. Also, wires can connect the DIMMs via a side of each DIMM other than the side that connects them to PCB when inserted in memory slots.

Some embodiments can include an apparatus having a plurality of memory chips, a plurality of electrical contacts, and one or more special-purpose controllers. And, such an apparatus can have a network interface device configured to communicate input and output data of the special-purpose controller over one or more communication networks that bypass a main processor of a computing device in which the apparatus is installed.

In some embodiments, such an apparatus can include a printed circuit board (PCB) configured for insertion into a memory slot of a motherboard. And, the plurality of memory chips can be coupled to the PCB. And, the plurality of electrical contacts can be on each side of the PCB. Also, the special-purpose controller(s) can be coupled to the PCB. And, the network interface device can be coupled to the PCB. In such examples and others, the special-purpose controller(s) can include a graphics processing unit (GPU) and/or another type of special-purpose controller such as an AI accelerator. In such examples and others, the one network interface device can include a wireless network interface device configured to communicate over one or more wireless networks. And, the one or more communication networks can bypass a main data bus of the computing device in which the apparatus is installed.

The apparatus can also include first connections configured to connect the plurality of memory chips to at least some of the plurality of electrical contacts to communicate input and output data of the plurality of memory chips to the main processor of the computing device in which the system is installed. The apparatus can also include second connections configured to connect the plurality of memory chips to the special-purpose controller. And, the apparatus can include a third connection configured to connect the special-purpose controller to the network interface device so that the network interface device receives input data for the special-purpose controller from other devices and communicates output data of the special-purpose controller to other devices via a communications path that bypasses the main processor of the computing device in which the apparatus is installed.

The apparatus can also include an arbiter configured to resolve conflicts when the main processor attempts to access data in the plurality of memory chips while a special-purpose controller is accessing the plurality of memory chips.

Some embodiments can include a system having a plurality of dual in-line memory modules (DIMMs). Each DIMM of the plurality of DIMMs can include a PCB configured for insertion into a memory slot of an additional PCB that is separate from the plurality of DIMMs. Each DIMM of the plurality of DIMMs can include a plurality of memory chips coupled to the PCB and a plurality of electrical contacts on each side of the PCB. Each DIMM of the plurality of DIMMs can include a special-purpose controller coupled to the PCB. And, each DIMM of the plurality of DIMMs can include a network interface device coupled to the PCB and configured to communicate over one or more communication networks that bypass a main processor of a computing device in which the system is installed.

In some embodiments, such a system can include an external controller that is separate from the plurality of DIMMs and that is configured to coordinate computations by the special-purpose controllers of the plurality of DIMMs. And, in such embodiments, the system can have the additional PCB that is separate from the plurality of DIMMs and that includes a plurality of memory slots configured to receive the plurality of DIMMs. And, the external controller can be coupled to the additional PCB. Also, in such embodiments, the additional PCB can be a motherboard and the external controller can include a central processing unit (CPU).

In such examples and others, the special-purpose controller can include a GPU and/or another type of special-purpose controller such as an AI accelerator. And, in such examples and others the network interface device of each DIMM of the plurality of DIMMs can include a wireless network interface device configured to communicate over a wireless network.

In some embodiments, for each DIMM of the plurality of DIMMs, the wireless network interface device of the DIMM is configured to receive input data for the special-purpose controller and communicate output data of the special-purpose controller to one or more displays via one or more wireless communications links that bypass the main processor of the computing device in which the system is installed.

Some embodiments can include a DIMM. The DIMM can include a printed circuit board (PCB) configured for insertion into a memory slot of a motherboard. The DIMM can also include a plurality of memory chips coupled to the PCB and a plurality of electrical contacts on each side of the PCB. The DIMM can also include a special-purpose controller coupled to the PCB. The DIMM can also include a network interface device coupled to the PCB and configured to communicate input and output data of the special-purpose controller over one or more communication networks that bypass a main processor of a computing device in which the DIMM is installed. In such embodiments and others, and where the DIMM is in a mobile device, the DIMM can be a small outline dual in-line memory module (SO-DIMM). Also, in such examples and others, the special-purpose controller includes a graphics processing unit (GPU) and/or another type of special-purpose controller such as an AI accelerator. And, in such examples and others, the network interface device can include a wireless network interface device configured to communicate over one or more wireless networks.

Further, in such examples and others, the DIMM can include first connections configured to connect the plurality of memory chips to at least some of the electrical contacts to communicate input and output data of the plurality of memory chips to the main processor of the computing device in which the system is installed. The DIMM can also include second connections configured to connect the plurality of memory chips to the GPU. And, The DIMM can include a third connection configured to connect the GPU to the network interface device so that the network interface device receives input data for the GPU from other devices and communicates output data of the GPU to other devices via a communications path that bypasses the main processor of the computing device in which the DIMM is installed.

Further, in such examples and others, the one or more communication networks bypass a main data bus of the computing device in which the DIMM is installed.

And, the DIMM can include an arbiter configured to resolve conflicts when the main processor attempts to access data in the plurality of memory chips while the special-purpose controller is accessing the plurality of memory chips of the DIMM.

Figure 5:
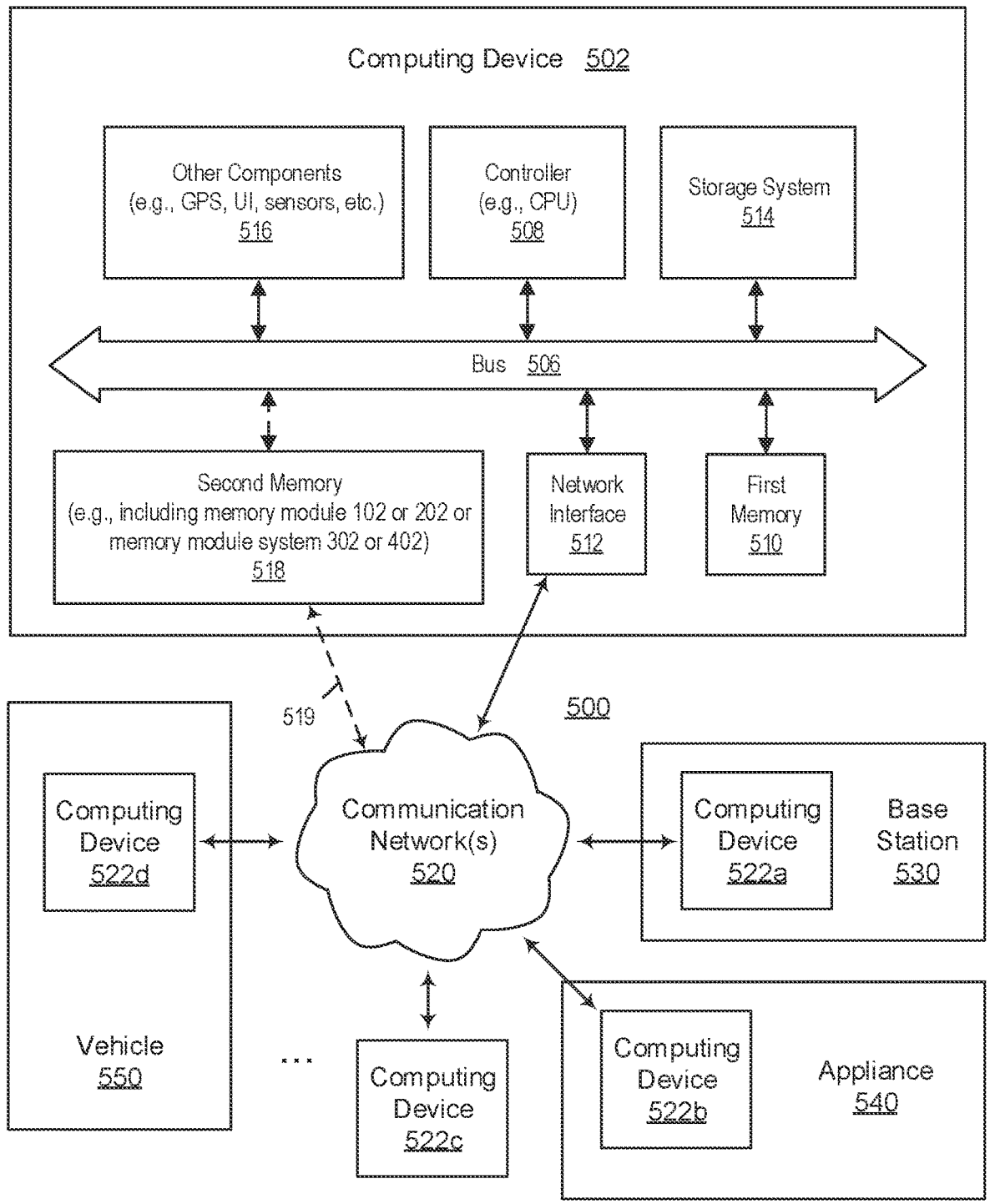
FIG. 5 illustrates an example networked system that includes computing devices, in accordance with some embodiments of the present disclosure.

FIG. 5 illustrates the example networked system 500 that includes at least computing devices 502, 522a, 522b, 522c, and 522d, in accordance with some embodiments of the present disclosure. Also, FIG. 5 illustrates example parts of an example computing device 502 which is part of the networked system 500. And, FIG. 5 shows how such computing devices can be integrated into various machines, apparatuses, and systems, such as IoT devices, mobile devices, communication network devices and apparatuses (e.g., see base station 530), appliances (e.g., see appliance 540), and vehicles (e.g., see vehicle 550).

The computing device 502 and other computing devices of the networked system 500 (e.g., see computing devices 522a, 522b, 522c, and 522d) can be communicatively coupled to one or more communication networks 520. The computing device 502 includes at least a bus 506, a controller 508 (such as a CPU), first memory 510, a network interface 512, a data storage system 514, other components 516 (which can be any type of components found in mobile or computing devices such as GPS components, I/O components such various types of user interface components, and sensors as well as a camera), and second memory 518 (which can include memory module 102 or 202 or memory module system 302 or 402). The other components 516 can include one or more user interfaces (e.g., GUIs, auditory user interfaces, tactile user interfaces, etc.), displays, different types of sensors, tactile, audio and/or visual input/output devices, additional application-specific memory, one or more additional controllers (e.g., GPU), or any combination thereof. The bus 506 communicatively couples the controller 508, the first memory 510, the network interface 512, the data storage system 514 and the other components 516, and can couple such components to the second memory 512 in some embodiments. As mentioned, it is to be understood that the dashed-lined boxes and connections represent optional components.

The computing device 502 includes a computer system that includes at least controller 508, first memory 510 and the second memory 518 (e.g., read-only memory (ROM), flash memory, dynamic random-access memory (DRAM) such as synchronous DRAM (SDRAM) or Rambus DRAM (RDRAM), static random-access memory (SRAM), cross-point or cross-bar memory, crossbar memory, etc.), and data storage system 514, which can communicate with each other via bus 506 (which can include multiple buses). In some embodiments, the second memory 518 may not communicate over bus 506.

To put it another way, FIG. 5 includes a block diagram of computing device 502 that has a computer system in which embodiments of the present disclosure can operate. In some embodiments, the computer system can include a set of instructions, for causing a machine to perform at least part any one or more of the methodologies discussed herein, when executed. In such embodiments, the machine can be connected (e.g., networked via network interface 512) to other machines in a LAN, an intranet, an extranet, and/or the Internet (e.g., see network(s) 520). The machine can operate in the capacity of a server or a client machine in client-server network environment, as a peer machine in a peer-to-peer (or distributed) network environment, or as a server or a client machine in a cloud computing infrastructure or environment.

Controller 508 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, single instruction multiple data (SIMD), multiple instructions multiple data (MIMD), or a processor implementing other instruction sets, or processors implementing a combination of instruction sets. Controller 508 can also be one or more special-purpose processing devices such as an ASIC, a programmable logic such as an FPGA, a digital signal processor (DSP), network processor, or the like. Controller 508 is configured to execute instructions for performing the operations and steps discussed herein. Controller 508 can further include a network interface device such as network interface 512 to communicate over one or more communication networks (such as network(s) 520).

The data storage system 514 can include a machine-readable storage medium (also known as a computer-readable medium) on which is stored one or more sets of instructions or software embodying any one or more of the methodologies or functions described herein. The data storage system 514 can have execution capabilities such as it can at least partly execute instructions residing in the data storage system. The instructions can also reside, completely or at least partially, within at least one of the first memory 510 and the second memory 518 and/or within the controller 508 during execution thereof by the computer system, at least one of the first memory 510 and the second memory 518 as well as the controller 508 also constituting machine-readable storage media. The first memory 510 can be or include main memory of the computing device 502. The first memory 510 and the second memory 518 can have execution capabilities such as it can at least partly execute instructions residing in the memory.

As mentioned, the networked system 500 includes computing devices, and each of the computing devices can include one or more buses, a controller, a memory, a network interface, a storage system, and other components. Also, each of the computing devices shown in FIG. 5 and described herein can include or be a part of a mobile device or the like, e.g., a smartphone, tablet computer, IoT device, smart television, smart watch, glasses or other smart household appliance, in-vehicle information system, wearable smart device, game console, PC, digital camera, or any combination thereof. As shown, the computing devices can be connected to network(s) 520 that includes at least a local to device network such as Bluetooth or the like, a wide area network (WAN), a local area network (LAN), an intranet, a mobile wireless network such as 4G or 5G, an extranet, the Internet, and/or any combination thereof. In some embodiments, as shown with the dashed connection 519, the second memory 518 can include at least one network interface so that it can communicate separately with other devices via communication network(s) 520. For example, a memory module or a memory module system of the second memory 518 (e.g., see memory modules 102 and 202, and memory module systems 302 and 402) can have its own network interface so that such a component can communicate separately with other devices via communication network(s) 520.

Each of the computing devices described herein can be or be replaced by a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine.

Also, while a single machine is illustrated for the computing device 502 shown in FIG. 5, the term "machine" shall also be taken to include any collection of machines that individually or jointly execute a set (or multiple sets) of instructions to perform one or more of the methodologies or operations discussed herein. And, each of the illustrated computing devices as well as computing systems can each include at least a bus and/or motherboard, one or more controllers (such as one or more CPUs), a main memory that can include temporary data storage, at least one type of network interface, a storage system that can include permanent data storage, and/or any combination thereof. In some multi-device embodiments, one device can complete some parts of the methods described herein, then send the result of completion over a network to another device such that another device can continue with other steps of the methods described herein.

While the memory, controller, and data storage parts are shown in the example embodiment to each be a single part, each part should be taken to include a single part or multiple parts that can store the instructions and perform their respective operations. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a memory module, having:
a first bus in the memory module;
a plurality of memory chips connected to the first bus;
a first controller coupled to the first bus;
a second controller coupled to the first bus, wherein the second controller comprises at least one graphics processing unit (GPU); and
at least one interface device coupled to the first bus and configured to communicate input and output data for the memory module; and
facilitate communication among a plurality of instances of the memory module generated via a global shared context implemented by the memory module to facilitate processing of the data proximate to the memory module by the GPU;
at least one arbiter configured to:
queue memory requests to each of the plurality of memory chips for the data; and
resolve at least one conflict when a processor outside of the memory module attempts to access the data in the plurality of memory chips while the first or second controller is accessing the plurality of memory chips;
wherein the first bus is connectable as a part of a second bus to which the processor outside of the memory module is connected; and
wherein the least one interface device is configured to bypass the second bus and the processor.

2. The apparatus of claim 1, wherein the interface device is configured to communicate the input and output data to at least one other instance of the apparatus, bypassing a second bus connected to a processor in a system in which the apparatus is installed; and the first bus is connectable to the second bus.

3. The apparatus of claim 1, comprising:
a plurality of electrical contacts; and
a printed circuit board (PCB) configured for insertion into at least one memory slot of a motherboard;
and wherein:
the plurality of memory chips is coupled to the PCB;
the plurality of electrical contacts is on each side of the PCB;
the at least one special-purpose controller is coupled to the PCB; and
the at least one interface device is coupled to the PCB.

4. The apparatus of claim 1, wherein the at least one interface device comprises at least one wireless interface device that communicates at least in part wirelessly.

5. The apparatus of claim 1, wherein the least one interface device is configured to bypass the second bus and the processor when communicating the input and output data for the memory module.

6. A system, comprising:
a plurality of dual in-line memory modules (DIMMs), each DIMM of the plurality of DIMMs, comprising:
a printed circuit board (PCB) configured for insertion into at least one memory slot of an additional PCB that is separate from the plurality of DIMMs;
a plurality of memory chips coupled to the PCB;
a plurality of electrical contacts on each side of the PCB;
at least one special-purpose controller coupled to the PCB, wherein the at least one special-purpose controller of at least one DIMM of the plurality of DIMMs comprises at least one graphics processing unit (GPU); and
at least one interface device configured to:
communicate input and output data for the DIMM, wherein the input and output data bypasses at least one processor of a computing device in which the system is installed; and
facilitate communication among a plurality of instances of the plurality of DIMMs generated via a global shared context implemented by the DIMMs to facilitate processing of the data proximate to the DIMMs by the GPU; and
at least one arbiter configured to:
queue memory requests to each of the plurality of DIMMs for the data; and
resolve at least one conflict when the at least one processor attempts to access the data in the plurality of memory chips while at least one special-purpose controller is accessing the plurality of memory chips.

7. The system of claim 6, wherein the at least one interface device is configured to communicate the input and output data to at least one other DIMM of the plurality of DIMMs.

8. The system of claim 6, comprising:
at least one external controller that is separate from the plurality of DIMMs and that is configured to:
coordinate computations by the special-purpose controllers of the plurality of DIMMs; and
coordinate communications by the interface devices of the plurality of DIMMs; and
the additional PCB, wherein the additional PCB is separate from the plurality of DIMMs and comprises a plurality of memory slots configured to receive the plurality of DIMMs, wherein the at least one external controller is coupled to the additional PCB, and wherein the additional PCB is a motherboard and the at least one external controller comprises at least one central processing unit (CPU).

9. The system of claim 6, wherein the at least one interface device of at least one DIMM of the plurality of DIMMs comprises intra-chip optical interconnect.

10. The system of claim 9, wherein, for each DIMM of the plurality of DIMMs, the at least one wireless interface device of the DIMM is configured to receive input data for the at least one special-purpose controller and communicate output data of the at least one special-purpose controller to one or more user interfaces via one or more wireless communication links that bypass the at least one processor of the computing device in which the system is installed.

11. A memory module, comprising:
a plurality of memory chips;
at least one special-purpose controller, wherein the at least one special-purpose controller of at least comprises at least one graphics processing unit (GPU); and
at least one interface device configured to communicate input and output data for the memory module, wherein the input and output data bypasses at least one processor of a computing device in which the memory module is installed, and wherein the at least one interface device is configured to:
communicate the input and output data to at least one other memory module in the computing device; and
facilitate communication among a plurality of instances of the memory module generated via a global shared context implemented by the memory module to facilitate processing of the data proximate to the memory module by the GPU;

at least one arbiter configured to:
- queue memory requests to each of the plurality of memory chips for the data; and
- resolve at least one conflict when the at least one processor attempts to access the data in the plurality of memory chips while the at least one special-purpose controller is accessing the plurality of memory chips.

12. The memory module of claim 11, wherein the one interface device is a network interface device configured to communicate input and output data of the at least one special-purpose controller over one or more communication networks.

13. The memory module of claim 11, wherein the at least one special-purpose controller comprises at least one artificial intelligence (AI) accelerator.

14. The memory module of claim 11, wherein the at least one special-purpose controller comprises at least one processing-in-memory (PIM) unit.

15. The memory module of claim 11, wherein the at least one interface device comprises at least one wireless interface device configured to communicate at least in part wirelessly over one or more wireless communication networks, and wherein the one or more wireless communication networks bypass at least one data bus of the computing device in which the memory module is installed.

16. The memory module of claim 11, wherein the least one interface device is configured to bypass the at least one processor when communicating the input and output data for the memory module.

* * * * *